US006918098B2

(12) United States Patent
Smith et al.

(10) Patent No.: US 6,918,098 B2
(45) Date of Patent: Jul. 12, 2005

(54) RANDOM CODE GENERATION USING GENETIC ALGORITHMS

(75) Inventors: Zachary Steven Smith, Fort Collins, CO (US); Lee Becker, Fort Collins, CO (US); David Albert Heckman, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 456 days.

(21) Appl. No.: 10/195,993

(22) Filed: Jul. 16, 2002

(65) Prior Publication Data

US 2004/0015791 A1 Jan. 22, 2004

(51) Int. Cl.[7] .................. G06F 17/50; G06F 19/00; G06F 11/263; G01R 31/3183
(52) U.S. Cl. .............. 716/4; 716/18; 703/16; 703/26; 703/28; 714/28; 714/33; 714/39; 714/728; 714/735; 714/739; 702/118
(58) Field of Search .............. 716/4, 18; 703/16, 703/26, 28; 702/118; 714/28, 33, 39, 728, 735, 739

(56) References Cited

U.S. PATENT DOCUMENTS 3,719,885 A * 3/1973 Carpenter et al. .......... 714/739
4,697,242 A    9/1987 Holland et al. ............ 706/13

(Continued)

FOREIGN PATENT DOCUMENTS

WO    WO 9815145 A2 * 4/1998 ............ H04Q/7/22

OTHER PUBLICATIONS

Chen et al., "A heuristic approach based on the state equations of Petri nets for FMS scheduling", International IEEE/IAS Conference on Industrial Automation and Control, May 22, 1995, pp. 275–281.*

Hachtel et al., "The Sparse Tableau Approach to Network Analysis and Design", IEEE Transactions on Circuits and Systems, vol. 18, No. 1, Jan. 1971, pp. 101–113.*

Automatic Test Bench Generation for Validation of RT–level Descriptions: an Industrial Experience, 2000, F. Corno, M. Sonza Reorda, G. Squillero, A. Manzone, A. Pincetti, 5 pgs.

*Primary Examiner*—Matthew Smith
*Assistant Examiner*—Phallaka Kik

(57) ABSTRACT

Techniques are disclosed for automatically generating test instructions for use in testing a microprocessor design. A configuration file includes a plurality of knobs which specify a probability distribution of a plurality of microprocessor instructions. A random code generator takes the configuration file as an input and generates test instructions which are distributed according to the probability distribution specified by the knobs. The test instructions are executed on the microprocessor design. The microprocessor behaviors that are exercised by the test instructions are measured and a fitness value is assigned to the configuration file using a fitness function. The configuration file and its fitness value are added to a pool of configuration files. A configuration file synthesizer uses a genetic algorithm to synthesize a new configuration file from the pool of existing configuration files. This process may be repeated to generate configuration files which increasingly exercise microprocessor behaviors which are of interest.

16 Claims, 12 Drawing Sheets

U.S. PATENT DOCUMENTS

| | | | |
|---|---|---|---|
| 5,136,686 A | 8/1992 | Koza | 706/13 |
| 5,202,889 A | 4/1993 | Aharon et al. | 714/739 |
| 5,245,550 A * | 9/1993 | Miki et al. | 716/13 |
| 5,323,400 A * | 6/1994 | Agarwal et al. | 714/728 |
| 5,488,573 A | 1/1996 | Brown et al. | 703/21 |
| 5,490,249 A | 2/1996 | Miller | 714/38 |
| 5,526,517 A * | 6/1996 | Jones et al. | 707/8 |
| 5,542,043 A | 7/1996 | Cohen et al. | 714/32 |
| 5,572,666 A | 11/1996 | Whitman | 714/32 |
| 5,646,949 A | 7/1997 | Bruce, Jr. et al. | 714/739 |
| 5,708,774 A | 1/1998 | Boden | 714/38 |
| 5,729,554 A | 3/1998 | Weir et al. | 714/739 |
| 5,754,760 A | 5/1998 | Warfield | 714/37 |
| 5,764,857 A | 6/1998 | Suzuki | 706/13 |
| 5,774,726 A | 6/1998 | Ahmed | 717/143 |
| 5,819,074 A | 10/1998 | Mangelsdorf | 703/15 |
| 5,880,975 A | 3/1999 | Mangelsdorf | 703/15 |
| 5,913,023 A | 6/1999 | Szermer | 714/38 |
| 5,956,477 A | 9/1999 | Ranson et al. | 714/30 |
| 5,956,478 A | 9/1999 | Huggins | 714/33 |
| 5,958,072 A | 9/1999 | Jacobs et al. | 714/30 |
| 6,058,385 A | 5/2000 | Koza et al. | 706/13 |
| 6,088,510 A | 7/2000 | Sims | 716/13 |
| 6,212,493 B1 | 4/2001 | Huggins et al. | 703/22 |
| 6,253,344 B1 | 6/2001 | Fin et al. | 714/738 |
| 6,349,393 B1 | 2/2002 | Cox | 714/38 |
| 6,374,367 B1 * | 4/2002 | Dean et al. | 714/37 |
| 6,381,740 B1 * | 4/2002 | Miller et al. | 717/151 |
| 6,574,727 B1 * | 6/2003 | Davidson et al. | 712/227 |
| 6,625,501 B2 * | 9/2003 | Martin et al. | 700/44 |
| 6,691,080 B1 * | 2/2004 | Tachibana | 703/19 |
| 6,859,770 B2 * | 2/2005 | Ramsey | 703/16 |
| 2002/0065640 A1 * | 5/2002 | Ramsey | 703/16 |
| 2003/0188268 A1 * | 10/2003 | Konstadinidis et al. | 716/2 |

* cited by examiner

RANDOM CODE GENERATION USING GENETIC ALGORITHMS

BACKGROUND

1. Field of the Invention

The present invention relates to microprocessor design and, more particularly, to the automatic generation of test instructions for microprocessor designs.

2. Related Art

Various electronic design automation (EDA) software tools exist for designing microprocessors and other circuitry. Such tools allow circuit designers to create and modify virtual models of the circuit being designed. A circuit designer may, for example, specify a circuit design using a textual description written in a hardware description language (HDL), such as Verilog or VHDL, or by using a graphical user interface to manipulate a graphical representation of the circuit design.

Software tools are also frequently used for testing circuit designs, such as microprocessor designs. Referring to FIG. 1, for example, a prior art microprocessor test system 100 is shown in functional block diagram form. The system includes a microprocessor design 110, also referred to as a hardware model under test or design under test (DUT). Although the microprocessor design 110 may be either an actual (hardware) microprocessor or a software (simulated) model of a microprocessor, assume for purposes of the present discussion that the microprocessor design 110 is a software model of a microprocessor.

The microprocessor design 110 models both the operation of the microprocessor (e.g., the functional relationship between inputs and outputs of the microprocessor) and the state of the microprocessor's machine resources, such as its registers, cache(s), and main memory, at a particular point in time. The microprocessor design 110 may be implemented, for example, in a data structure in the memory of a computer or in a file stored on a hard disk or other computer-readable medium.

The system 100 also includes a simulator 114, which is typically implemented as a software program. The simulator 114 simulates the operation of the microprocessor modeled by the microprocessor design 110. A significant advantage of using simulators for testing is that they may detect errors prior to the costly and time-consuming fabrication of the microprocessor itself.

The system 100 also includes a test case 102, which specifies both initial values for the (simulated) machine resources of the microprocessor design 110 and test instructions to be executed (in simulation) by the microprocessor design 110. The test case 102 may also specify the outputs that are expected to result from performing the test instructions based on the specified initial values. The test case 102 may, for example, be implemented in a file stored on a computer-readable medium or as a data structure in the memory of a computer.

The simulator 114 receives the test case 102 as an input and initializes the (simulated) machine resources of the microprocessor design 110 with the initial values specified by the test case 102. The simulator 114 then simulates execution of the instructions specified by the test case 102 on the microprocessor design 110. The simulator 114 modifies the state of the microprocessor design 110 accordingly as the simulation progresses. The simulator 114 produces simulation results 118 which indicate, among other things, whether the output produced by executing the test instructions matches the expected output specified by the test case 102.

Although a human circuit designer 116 may create the test case 102 manually, the test case 102 is typically generated automatically by a software program referred to as a random code generator 112. The random code generator 112 creates random sequences of instructions that are intended to exercise the microprocessor design 110 more thoroughly than conventional application software. The random code generator 112 may generate large numbers of test cases automatically and rapidly, thereby facilitating the testing process.

Test cases (such as test case 102) generated by random code generator 112 are typically not, however, completely random. Rather, a good random code generator generates test cases which focus on key aspects of the microprocessor design 110 while retaining enough randomness to test the microprocessor design 110 thoroughly. The circuit designer 116 may use a configuration file 108 (also referred to as a "probability file") to exercise control over which test instructions are generated by the random code generator 112. The configuration file 108 may, for example, specify the frequencies with which different microprocessor instructions are to be simulated by the simulator 114. More specifically, configuration file 108 may include "knobs" 104. Each knob may specify one instruction or class of instructions by name and the frequency with which the instruction or instruction class should occur in the test case 102. The random code generator 112 is designed to generate test cases in which the distribution of instructions and/or instruction classes at least roughly matches the probability distribution specified by the knobs 104.

Microprocessors and microprocessor designs, such as the microprocessor design 110, typically have a performance monitoring unit (PMU) which includes event counters 106 that count the number of times that various events occur in the microprocessor design 110. Examples of events which may be counted by event counters 106 include, for example, the number of times the microprocessor's current privilege level (CPL) changes, the amount of traffic on the microprocessor's instruction translation lookaside buffer (ITLB) and/or data translation lookaside buffer (DTLB), the number of CPU cycles, the number of retired (executed and committed) null operations, the number of retired load/store operations, and the number of Level 1 and/or Level 2 cache hits and/or misses. The execution of particular test instructions, or the results produced by executing such instructions, may cause one or more events to occur. Each time a particular event occurs, the corresponding one of the event counters 106 is incremented.

When testing the microprocessor design 110 it is often desirable to thoroughly test (or "exercise") the entire range of events. In particular circumstances, however, the circuit designer 116 may wish to focus the simulation on a particular event or events. It is difficult, however, for the circuit designer 116 to design the configuration file 108 to test (or "exercise") the entire range of events or particular events of interest because, for example, the relationship between the execution of particular instruction sequences and the occurrence of particular events may be complex and difficult to predict. Although the circuit designer 116 may improve the extent to which the configuration file 108 exercises particular events by inspecting the event counters 106 and/or the simulation results 118 upon completion of the simulation performed by the simulator 114 and modifying the configuration file 108 manually in response, such a process is tedious, time-consuming, and not guaranteed to improve the extent to which the configuration file 108 exercises events of interest.

What is needed, therefore, are improved techniques for generating test instructions for microprocessor designs.

SUMMARY

Techniques are disclosed for automatically generating test instructions for use in testing a microprocessor design. A configuration file includes a plurality of knobs which specify a probability distribution of a plurality of microprocessor instructions. A random code generator takes the configuration file as an input and generates test instructions based on the probability distribution specified by the knobs. The test instructions are executed on the microprocessor design. The microprocessor behaviors that are exercised by the test instructions are measured and a fitness value is assigned to the configuration file using a fitness function. The configuration file and its fitness value are added to a pool of configuration files. A configuration file synthesizer uses a genetic algorithm to synthesize a new configuration file from the pool of existing configuration files. This process may be repeated to generate configuration files which increasingly exercise microprocessor behaviors which are of interest.

In one aspect, the present invention features a method for use in a system including a circuit design (e.g., a microprocessor design) and a plurality of circuit input vectors (e.g., a plurality of microprocessor test instructions) which have been applied to the circuit design to produce at least one occurrence of at least one event within the circuit design. The method includes steps of: (A) identifying a plurality of counter values indicating a number of occurrences of each of a plurality of events; and (B) applying a fitness function to the plurality of counter values to produce an aggregate fitness value for the plurality of circuit input vectors. The fitness function may, for example, be the sum of the plurality of counter values, or the sum of the expression $1+A+B*\log(c_i)$ for each counter value $c_i$. The value of A may, for example, be zero and the value of B may, for example, be one. The circuit design may be a physical circuit or a software model of the circuit. The plurality of events may be events monitored by a performance monitoring unit associated with the circuit design.

In another aspect, the present invention features a method for use in a system including a circuit design and a plurality of configuration files, the plurality of configuration files including a plurality of knobs having a plurality of values specifying a plurality of probability distributions of a plurality of circuit input vectors. The method includes steps of: (A) initializing a synthesized configuration file; (B) selecting a first subset of the plurality of configuration files as a potential parent pool; and (C) for each knob $K_P$ included in at least one of the plurality of configuration files in the potential parent pool, providing a synthesized value for knob $K_P$ in the synthesized configuration file based on at least one value of knob $K_P$ in the plurality of configuration files in the potential parent pool. The plurality of configuration files may be associated with a plurality of fitness values, and the step (B) may include a step of: (B)(1) selecting as the first subset the plurality of configuration files having the highest fitness values in the plurality of configuration files.

The method may further include a step, performed prior to the step (C), of: (D) replacing the plurality of configuration files in the potential parent pool with a subset of the plurality of configuration files in the potential parent pool. The subset may be randomly selected from the plurality of configuration files in the potential parent pool. The step (C) may include a step of: (C)(1) for each knob $K_P$ included in at least one of the plurality of configuration files in the potential parent pool, selecting the synthesized value for knob $K_P$ in the synthesized configuration file from among the at least one value of knob $K_P$ in the plurality of configuration files in the potential parent pool.

The step (B) may include steps of: (B)(1) for each knob $K_P$ which is included in all of the plurality of configuration files in the potential parent pool, selecting the synthesized value for knob $K_P$ from the at least one value of knob $K_P$ in the plurality of configuration files in the potential parent pool; and (B)(2) for each knob $K_P$ which is not included in all of the plurality of configuration files in the potential parent pool, performing steps of: (B)(2)(a) identifying the ratio of the number of configuration files in the potential parent pool which include the knob $K_P$ to the number of configuration files in the potential parent pool; and (B)(2)(b) determining whether to provide the synthesized value for knob $K_P$ in the synthesized configuration file based on the ratio. The step (B)(2)(b) may include steps of: (B)(2)(b)(i) randomly selecting a number $x_1$; and (B)(2)(b)(ii) deciding to provide the synthesized value for knob $K_P$ in the synthesized configuration file only if $x_1$ is less than the ratio.

In yet another aspect of the present invention, a method is provided for use in a system including a circuit design and a plurality of configuration files, the plurality of configuration files including a plurality of knobs having a plurality of values specifying a plurality of probability distributions of a plurality of circuit input vectors. The method includes steps of: (A) initializing a synthesized configuration file; (B) selecting a subset of the plurality of configuration files having the highest fitness values as a potential parent pool; (C) randomly selecting a subset of the potential parent pool as a plurality of direct parents; and (D) for each knob $K_P$ included in at least one of the direct parents, providing a synthesized value for knob $K_P$ in the synthesized configuration file based on at least one value of knob $K_P$ in the plurality of direct parents.

The step (D) may include steps of: (D)(1) determining whether knob $K_P$ is included in all of the direct parents; (D)(2) selecting the synthesized value for knob $K_P$ from among the at least one value of knob $K_P$ in the plurality of direct parents if it is determined that knob $K_P$ is included in all of the direct parents; and (D)(3) if it is determined that knob $K_P$ is not included in all of the direct parents, performing steps of: (D)(3)(a) selecting a probability $p_1$ that the synthesized value for knob $K_P$ will not be included in the synthesized configuration file; (D)(3)(b) randomly selecting a number $x_1$; and (D)(3)(c) including the synthesized value for knob $K_P$ in the synthesized configuration file only if $x_1$ is less than $p_1$. The step (D)(3)(a) may include a step of selecting as the probability $p_1$ the ratio of the number of direct parents which include the knob $K_P$ to the number of direct parents.

The step (D)(2) may include steps of: (D)(2)(a) selecting a probability $p_2$; (D)(2)(b) randomly selecting a number $x_2$; (D)(2)(c) selecting the synthesized value for knob $K_P$ from among the at least one value of knob $K_P$ in the direct parents if $x_2$ is greater than $p_2$; and (D)(2)(d) if $x_2$ is not greater than $p_2$, performing steps of: (D)(2)(d)(i) identifying a range $R_P$ of values of knob $K_P$ in the direct parents; and (D)(2)(d)(ii) selecting the synthesized value for knob $K_P$ from within the range $R_P$. The method may further include a step of: (D)(2)(d)(iii) expanding the range $R_P$ to generate an expanded range $R_E$; and the step (D)(2)(d)(ii) may include a step of selecting the synthesized value for knob $K_P$ from within the expanded range $R_E$.

In another aspect of the present invention, a method is provided for use in a system including a circuit design and a plurality of configuration files, the plurality of configuration files including a plurality of knobs having a plurality of values specifying a plurality of probability distributions of a plurality of circuit input vectors. The method includes steps of: (A) generating a first synthesized configuration file based on the plurality of configuration files, the first synthesized configuration file specifying a first synthesized probability distribution of a first subset of the plurality of circuit input vectors; (B) using the first synthesized configuration file to generate a first test case comprising the first subset of the plurality of circuit input vectors; (C) providing the first subset of the plurality of circuit input vectors as inputs to the circuit design; (D) generating a fitness value based on at least one event counter in the microprocessor design, the at least one event counter comprising a count of at least one occurrence of at least one event in the microprocessor design in response to provision of the first subset of the plurality of circuit input vectors; (E) generating a graded configuration file including the synthesized configuration file and the fitness value; and (F) adding the graded configuration file to the plurality of configuration files.

The method may further include steps of: (G) after the step (F), generating a second synthesized configuration file based on the plurality of configuration files, the second synthesized configuration file specifying a second synthesized probability distribution of a second subset of the plurality of circuit input vectors; (H) using the second synthesized configuration file to generate a second test case comprising the second subset of the plurality of circuit input vectors; and (I) providing the second subset of the plurality of circuit input vectors as inputs to the circuit design.

Other features and advantages of various aspects and embodiments of the present invention will become apparent from the following description and from the claims.

DETAILED DESCRIPTION

Figure 1:
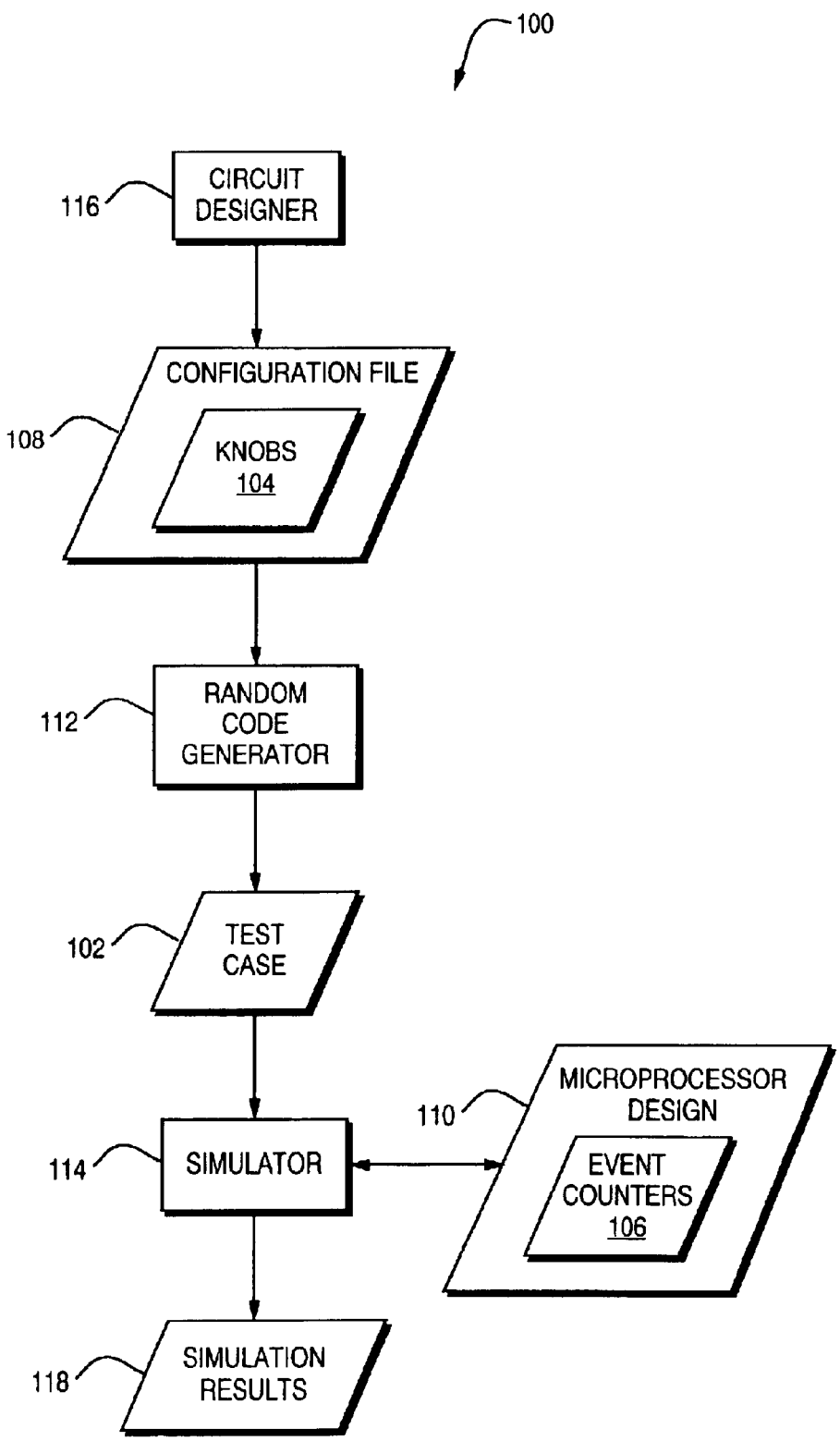
FIG. 1 is a data flow diagram of a prior art system for testing a microprocessor design.
Figure 2A:
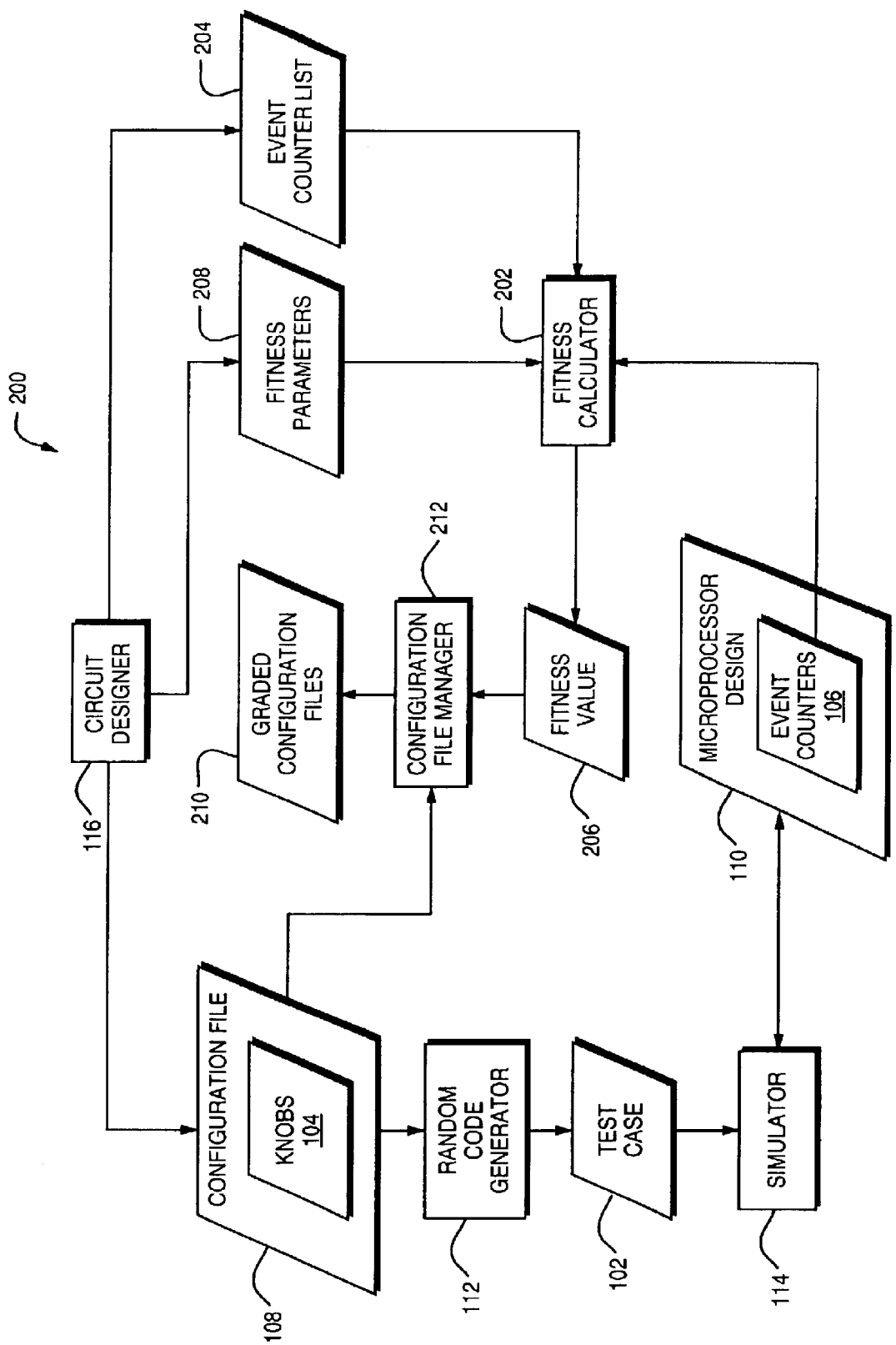
FIG. 2A is a data flow diagram of a system for testing a microprocessor design according to one embodiment of the present invention.

Referring to FIG. 2A, a system 200 for testing the microprocessor design 110 according to one embodiment of the present invention is shown. The system 200 includes configuration file 108, random code generator 112, test case 102, simulator 114, and microprocessor design 110, which may, for example, be conventional elements as described above with respect to FIG. 1. The system 200 also includes however, a fitness calculator 202 which may, for example, be implemented as a software program. Upon completion of the simulation performed by the simulator 114, the fitness calculator 202 may generate a fitness value 206 (also referred to herein as a "grade") which indicates the extent to which the test instructions in the test case 102 exercise events or other behaviors in the microprocessor design 110 that are of interest to the circuit designer 116. The fitness value 206 therefore indirectly indicates the fitness of the knobs 104 in the configuration file 108.

The circuit designer 116 may, for example, provide an event counter list 204 to the fitness calculator 202. The event counter list 204 may specify one or more of the event counters 106 which count events that are of interest to the circuit designer 116. The fitness calculator 202 generates the fitness value 206 based on the values of the event counters specified in the event counter list 204. The event counter list 204 may identify particular ones of the event counters in any manner. For example, each of the event counters 106 may have a unique identifier, such as a numerical or textual identifier, in which case the event counter list 204 may identify event counters using their unique identifiers.

The circuit designer 116 may also provide additional fitness parameters 208 to the fitness calculator 202 for use in generating the fitness value 206. Particular examples of the fitness parameters 208 are described below with respect to FIG. 4. Particular examples of techniques that the fitness calculator 202 may use to generate the fitness value 206 are described in more detail below with respect to FIG. 3B.

A configuration file manager 212 adds the configuration file 108, along with its associated fitness value 206, to a collection of graded configuration files 210. If the circuit designer 116 provides a new configuration file to the random code generator 112, the fitness calculator 202 will generate a new fitness value corresponding to the new configuration file. The configuration file manager 212 will add the new configuration file, along with its associated fitness value 206, to the graded configuration files 210.

Figure 2B:
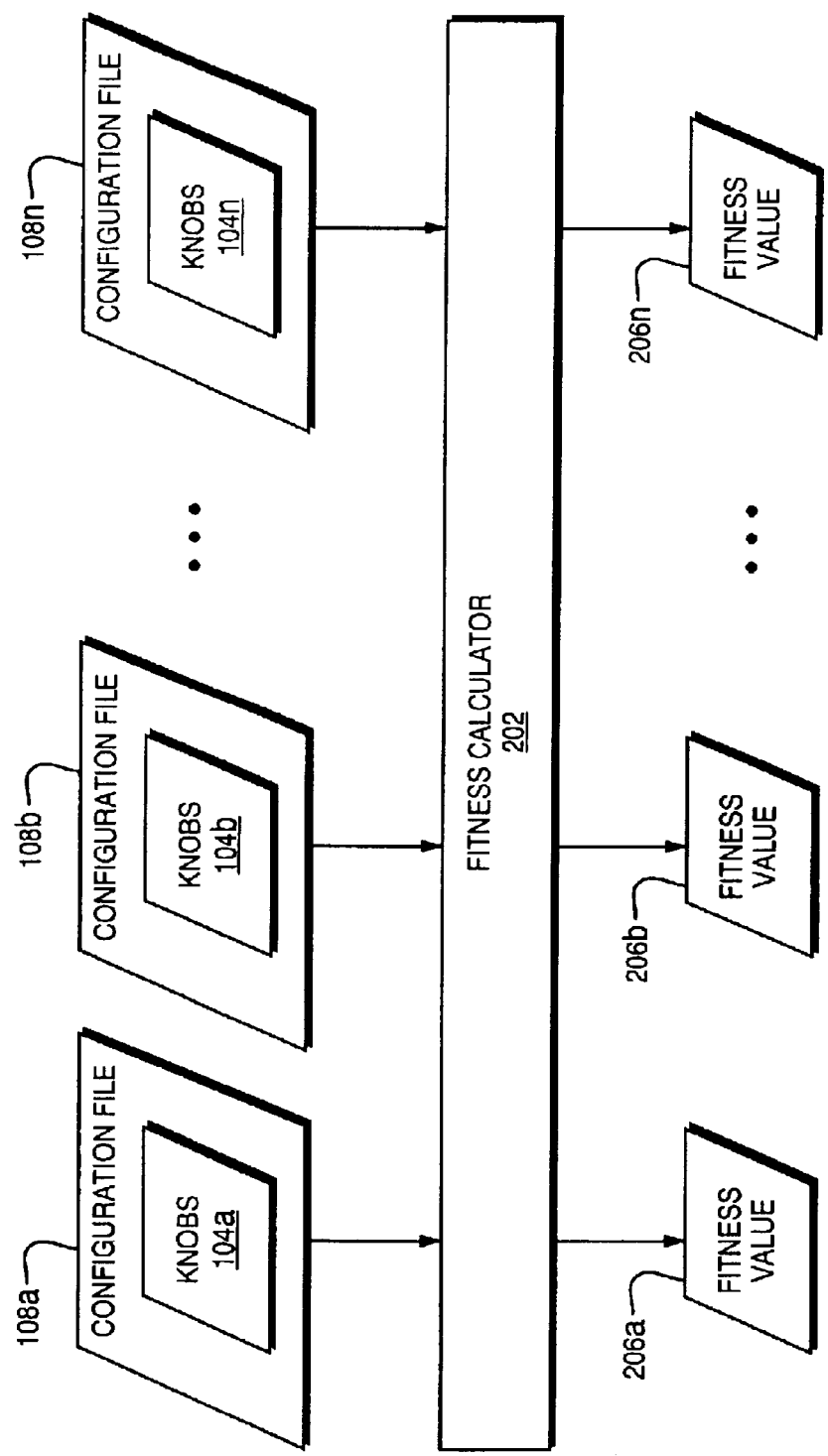
FIG. 2B is a diagram of a stream of configuration files and corresponding fitness values generated by a fitness calculator according to one embodiment of the present invention.

For example, referring to FIG. 2B, a stream of configuration files 108a–n is shown along with corresponding fitness values 206a–n, in which n is the number of configuration files and corresponding fitness values. Each of the configuration files 108a–n is used by the random code generator 112 to generate corresponding test cases. Although FIG. 2A shows only one test case 102 corresponding to the configuration file 108, the random code generator 112 typically generates many test cases from a single configuration file. Returning to FIG. 2B, for each of the configuration files 108a–n: (1) the simulator 114 simulates execution of each of the corresponding test cases on the microprocessor design 110, and (2) the fitness calculator 202 generates a corresponding one of the fitness values 206a–n. In other words, upon execution of all of the test cases corresponding to a particular one of the configuration files 108a–n, the fitness calculator 202 generates a fitness value for the configuration file. Although the configuration files 108a–n are illustrated as inputs to the fitness calculator 202 in FIG. 2B for ease of illustration, in practice the information contained in the configuration files 108a–n is only input to the fitness calculator 202 indirectly through the sequence of events illustrated in FIG. 2A.

Figure 2C:
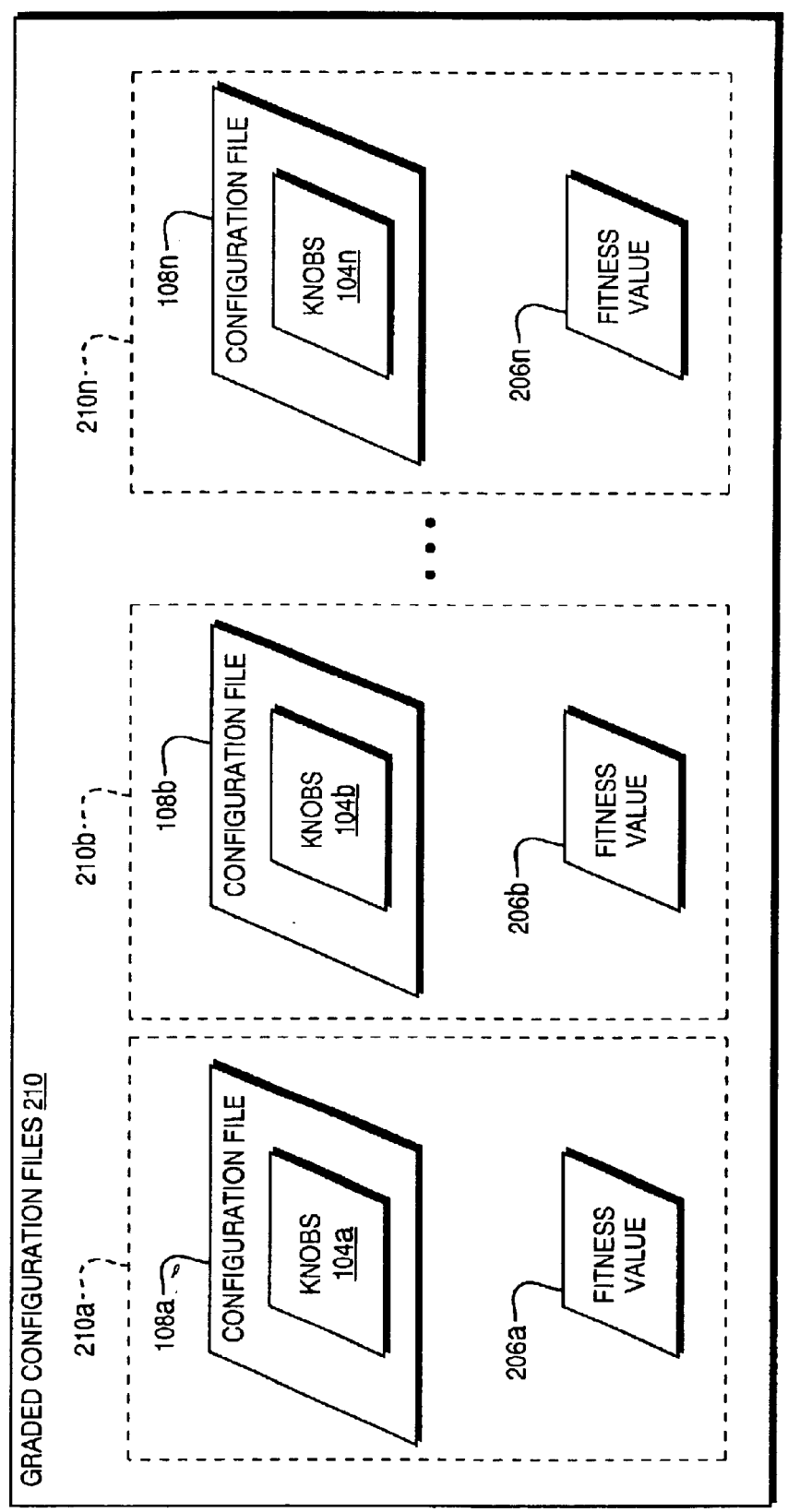
FIG. 2C is a diagram of a plurality of graded configuration files according to one embodiment of the present invention.

Referring to FIG. 2C, an example of the graded configuration files 210 is shown. In the example illustrated in FIG. 2C, graded configuration files 210 include graded configuration files 210a–n, each of which includes one of the configuration files 108a–n and a corresponding one of the fitness values 206a–n. For example, graded configuration file 210a includes configuration file 108a and the corresponding fitness value 206a. Although in the example described above the configuration files 108a–n are generated manually by the circuit designer 116, one or more of the configuration files 108a–n may be generated automatically, as described in more detail below.

Figure 2D:
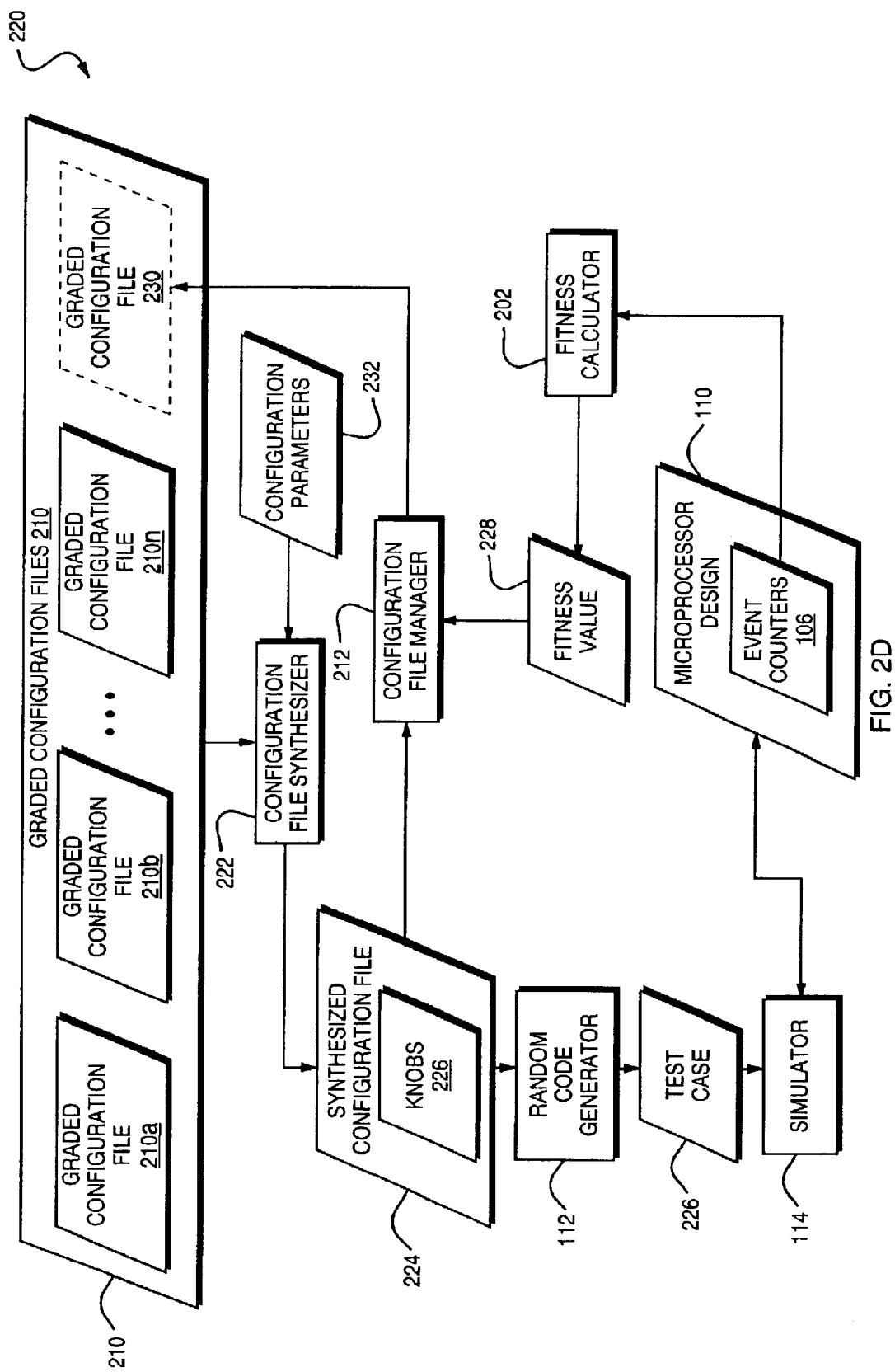
FIG. 2D is a data flow diagram of a system for synthesizing a new configuration file from existing graded configuration files according to one embodiment of the present invention.
Figure 3A:
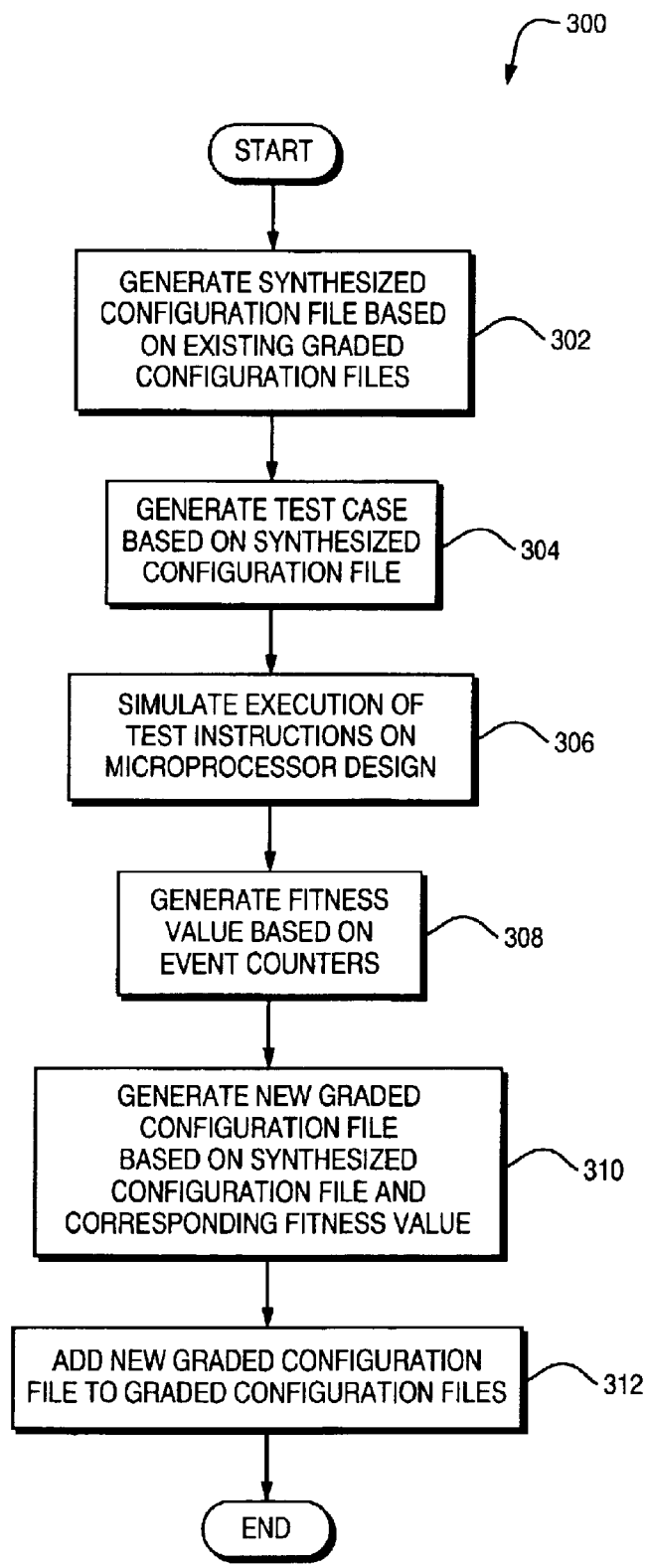
FIG. 3A is a flowchart of a method performed by the system of FIG. 2D for synthesizing a new configuration file from existing graded configuration files, assigning a grade to the synthesized configuration file, and adding the synthesized configuration file and corresponding grade to the graded configuration files according to one embodiment of the present invention.

Referring to FIG. 2D, a system 220 for synthesizing a new configuration file 224 from existing graded configuration files 210a–n is shown according to one embodiment of the present invention. Referring to FIG. 3A, a flowchart is shown of a method 300 that is performed by the system 220 according to one embodiment of the present invention. A configuration file synthesizer 222 takes as input the existing graded configuration files 210a–(illustrated in solid outline in FIG. 2D) and synthesizes from them the synthesized configuration file 224, containing knobs 226 (step 302). In particular, the configuration file synthesizer 222 may synthesize the synthesized configuration file 224 from the existing graded configuration files 210a–having the highest fitness values. As described in more detail below, the existing graded configuration files having the highest fitness values are referred to as the "potential parent pool." Various techniques that the configuration file synthesizer 222 may use to generate the synthesized configuration file 224 will be described in more detail below with respect to FIGS. 3C–5D.

The synthesized configuration file 224 is provided as input to the random code generator 112, which generates test case 226 based on the synthesized configuration file 224 in the manner described above with respect to FIG. 2A (step 304). Although only one test case 226 is shown in FIG. 2D, in practice the random code generator 112 may generate many test cases based on the synthesized configuration file 224. The simulator 114 simulates execution of the instructions in the test case 226 (and any other test cases which have been generated) on the microprocessor design 110, thereby causing the values of event counters 106 to change appropriately (step 306). The fitness calculator 202 generates a fitness value 228 for the synthesized configuration file 224 (step 308). (The fitness parameters 208 and the event counter list 204, shown in FIG. 2A, are also input to the fitness calculator 202 but are omitted from FIG. 2D for ease of illustration.) The configuration file manager 212 generates a graded configuration file 230 corresponding to the synthesized configuration file 224 and its corresponding fitness value 228 (step 310), and adds the graded configuration file 230 to the graded configuration files 210 (step 312). In this way, the synthesized configuration file 224 becomes available for use in synthesizing additional synthesized configuration files (by repeatedly performing method 300), which may in turn be used to synthesized additional synthesized configuration files, and so on.

As described in more detail below, the configuration file synthesizer 222 may synthesize the most fit ones of the existing graded configuration files 210a–n in such a manner that the knobs 226 in the synthesized configuration file 224 specify an instruction probability distribution that results in test cases which tend to better exercise the events that are of interest to the circuit designer 116 than the existing graded configuration files 210a–n. By generating synthesized configuration files in this way and using them as inputs to the random code generator 112, the system 220 tends to increasingly exercise the events that are of interest to the circuit designer 116.

Having described in general overview the operation of various embodiments of the present invention, embodiments of the present invention will now be described in more detail. For example, referring to FIG. 3B, a flow chart is shown of a method 308 that is performed by the fitness calculator 202 to calculate the fitness value 206 (referred to below by the variable V) according to one embodiment of the present invention.

The method 308 initializes the fitness value V (step 322). The fitness value V may be initialized to any appropriate value, such as zero or one. The method 308 enters a loop over each event counter e specified in the event counter list 204 (step 324). As described above, the event counter list 204 may specify a subset of the event counters 106 that is of interest to the circuit designer 116. The method 308 identifies the value $c_i$ of event counter e (step 326). As described above, the value $c_i$ represents the number of times that the corresponding event occurred while executing the test instructions in the test case 102.

Figure 4:
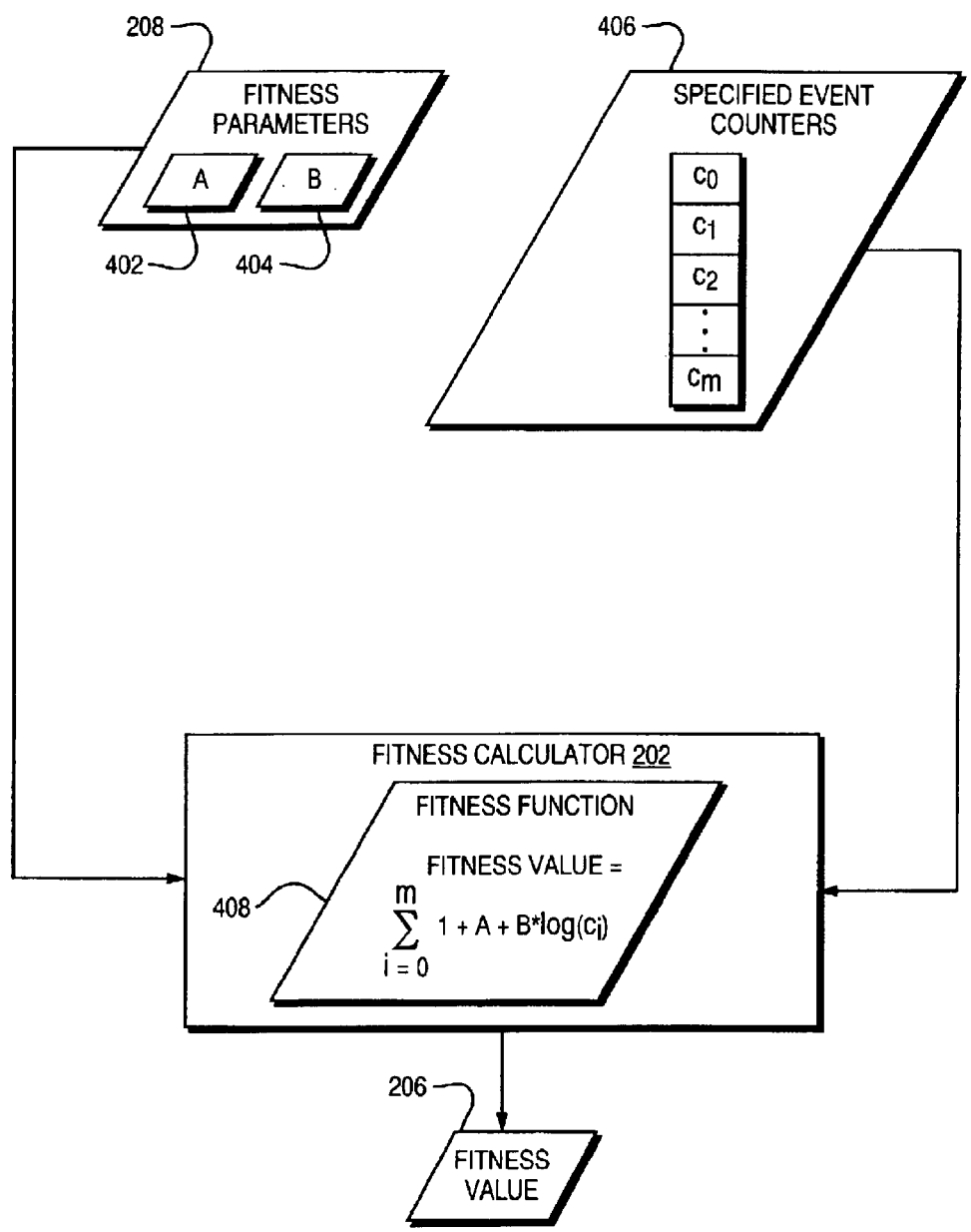
FIG. 4 is a data flow diagram of a system for generating a fitness value for a configuration file according to one embodiment of the present invention.

The fitness calculator 202 may include a fitness function. For example, referring to FIG. 4, one embodiment of the fitness calculator 202 is illustrated in more detail. As shown in FIG. 4, the fitness calculator includes a fitness function 408. In the particular embodiment illustrated in FIG. 4, the fitness parameters 208 include two parameters 402 and 404, designated by variables A and B, respectively. Specified event counters 406 include the values of the event counters specified in the event counter list 204. Specified event counters 406 includes event counter values $c_0, c_1, c_2, \ldots, c_m$, where m is the number of event counters specified in the event counter list 204. The method 308 may, for example, generate the list of specified event counters 406 prior to execution of the method 308 or retrieve each of the specified event counter values from the event counters 106 as needed.

The fitness function 408 may be any function. For example, the fitness function may simply be the sum of each of the counter values $c_1$. Such a fitness function provides a straightforward measure of fitness by making the fitness value equal to the total number of times that any event specified in the event counter list occurs during simulation.

Referring to FIG. 4, the fitness function alternatively may be the sum of the expression $(1+A+B*\log(c_i))$ for each counter value $c_i$. Such a function reflects a relatively strong interest in any event counter which has a non-zero value (corresponding to events which occurred at least once during simulation) and a relatively weak interest in additional occurrences of such events. In the event that the circuit designer 116 does not specify values for one or more of the fitness parameters 208, the fitness calculator 202 may provide default values. For example, in one embodiment default value for the A parameter is zero and the default value for the B parameter is one.

The fitness function 408 may, for example, include both: (1) a counter fitness function $f_1$ which generates a counter fitness value $V_i$ based on the value of the current event counter $c_i$, and (2) a combination function $f_2$ for combining the results of the counter fitness function $f_1$ for each of the error counter values. For example, returning to FIG. 3B, the method 308 may calculate counter fitness value $V_i$ based on the counter value $c_1$ using counter fitness function $f_1$ (step 328). The method 308 may update the value of V based on the current value of V and the value of $V_i$ using the combination function $f_2$ (step 330). The method 308 repeats steps 326–330 (step 332) to generate the final fitness value V, which is output as fitness value 206.

For example, in the embodiment illustrated in FIG. 4, the counter fitness function $f_1(c_1)=1+A+B*\log(c_1)$ and the combination function $f_2(V, V_i)=V+V_i$. In other words, if the fitness function 408 generates the fitness value 206 by summing the values of the specified event counters 406, the counter fitness function $f_1(c_i)=c_i$ and the combination function $f_2(V, V_i)=V+V_i$.

Figure 3B:
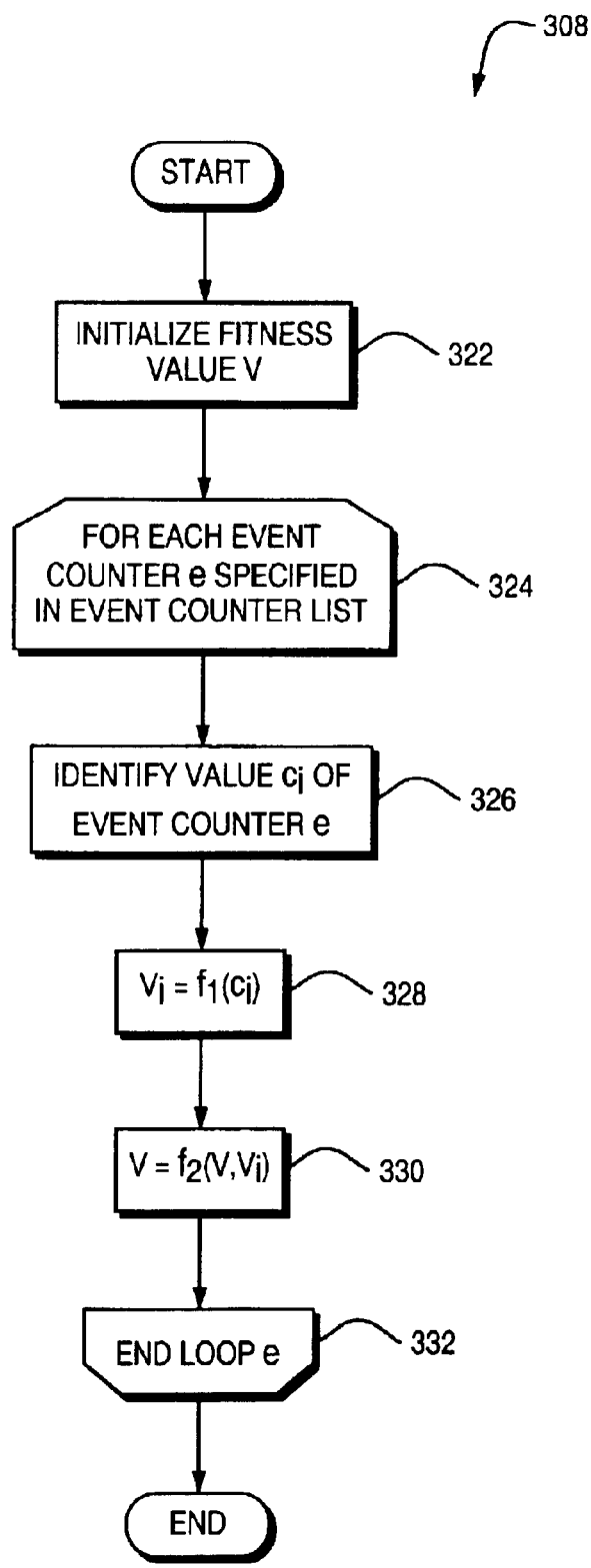
FIG. 3B is a flowchart of a method for calculating fitness value for a configuration file according to one embodiment of the present invention.

The method 308 illustrated in FIG. 3B may be applied to generate the fitness value 206 when the test case 102 is either a single test case or a plurality of test cases. If the test case 102 is a single test case, the method 308 may be applied to the generate the fitness value 206 based on the values of the event counters 106 after execution of the test case 102. If the test case 102 is a plurality of test cases, the values of the event counters 106 after execution of each test case may be combined in any of a variety of ways prior to being input to the method 308. For example, in one embodiment, the method 308 may be performed after the execution of each test case to generate a fitness value for each test case. The fitness values for each test case may then be combined by addition or some other function to generate the overall fitness value 206 for the configuration file 108.

Figure 3C:
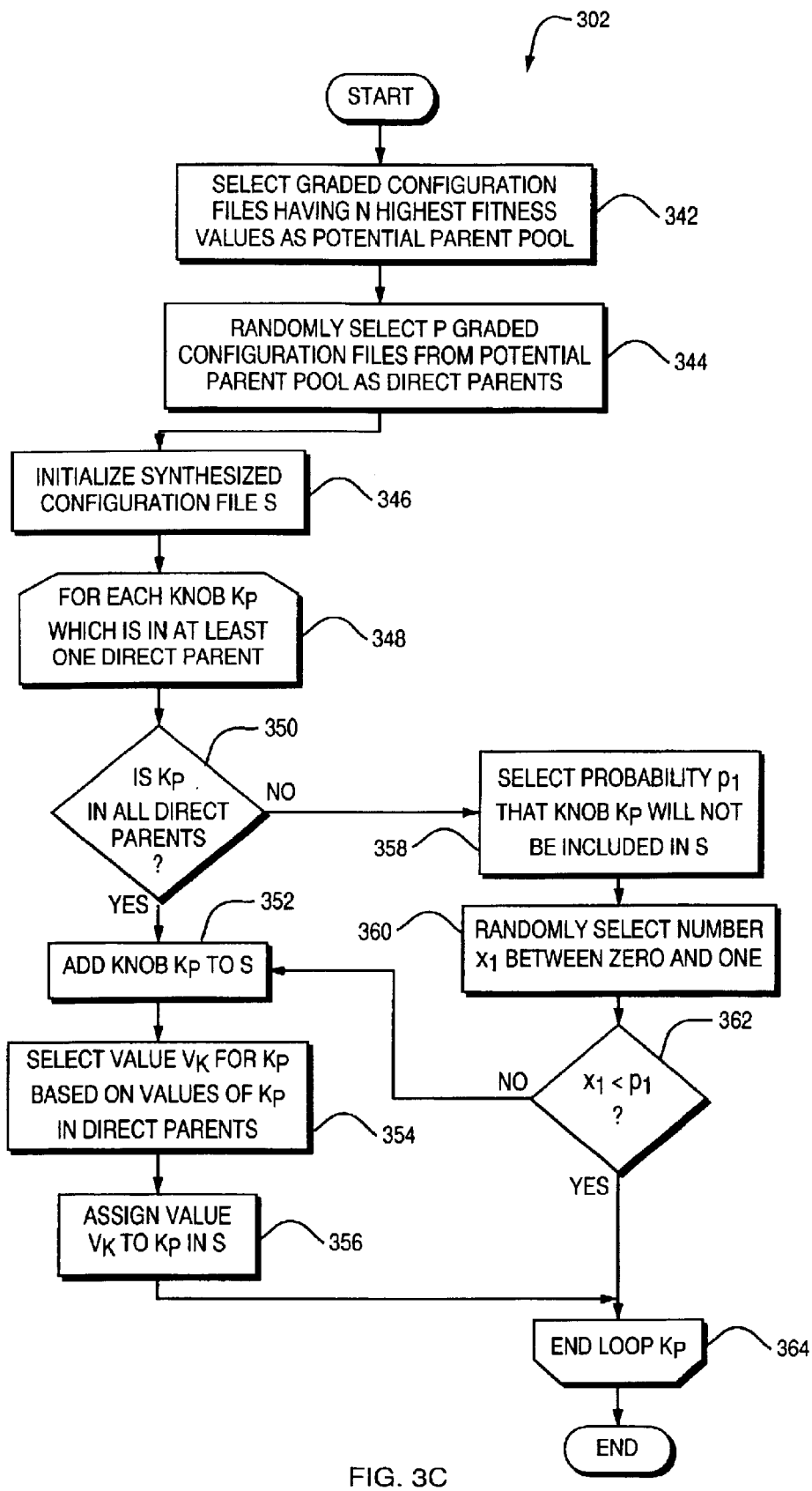
FIG. 3C is a flowchart of a method for synthesizing a new configuration file from existing configuration files according to one embodiment of the present invention.

As described above with respect to FIG. 3A, the configuration file synthesizer 222 may generate the synthesized configuration file 224 based on the existing graded configuration files 210a–(FIG. 3A, step 302). Referring to FIG. 3C, a flow chart is shown of a method that may be used to implement step 302. The method 302 selects the N graded configuration files having the highest fitness values (step 342). The configuration files selected in step 342 are referred to herein as the "potential parent pool." The configuration file synthesizer 222 may perform step 342 by, for example, sorting the graded configuration files 210a–in descending order of fitness value and selecting the first N graded configuration files in the sorted list as the potential parent pool. The configuration file synthesizer 222 may select the value N in any manner. Referring to FIG. 2D, for example, the circuit designer 116 may provide the value of N to the configuration file synthesizer 222 as one of a plurality of configuration parameters 232.

Returning to FIG. 3C, the method 302 randomly selects P graded configuration files from the potential parent pool (step 344). The graded configuration files selected in step 344 are referred to herein as "direct parents." The configuration file synthesizer 222 may select the value P in any manner. For example, the circuit designer 116 may provide the value of P as one of the configuration parameters 232. As described in more detail below, the configuration file synthesizer 222 synthesizes knob values from the direct parents to generate knob values for the synthesized configuration file 224.

As described above, the knobs 104 may specify individual instructions or instruction classes and corresponding probabilities. Each knob typically consists of a knob name and corresponding knob value. The knobs in a configuration file may therefore be represented as a list of knob name-value pairs. A knob name may, for example, be the name or other identifier of an instruction or a class of instructions. Examples of instruction classes include, but are not limited to, data transfer instructions, Arithmetic-Logic Unit (ALU) instructions, string instructions, floating point instructions, flag manipulation instructions, system instructions, semaphore instructions, Intel MMX™ instructions, instruction set switching branches, inter-segment branches, and intra-segment branches.

Returning to FIG. 3C, the method 302 initializes the synthesized configuration file 224 (step 346). Initializing the synthesized configuration file 224 may include, for example, creating an empty list of knob name-value pairs or creating a list of knob name-value pairs in which the values are undefined (such as null values). According to the description herein, a configuration file "includes" a knob if the configuration file includes a defined value for the knob. If, for example, a configuration file includes a knob name-value pair for a particular knob, but the value of the name-value pair is undefined (such as a null value), then the configuration file does not "include" the knob as that term is used herein. Similarly, a configuration file does not "include" a knob if the configuration file does not include a name-value pair for the knob.

The method 302 enters a loop over each knob $K_P$ which is included in at least one of the direct parents (step 348). The method 302 determines whether the knob $K_P$ is in all of the direct parents (step 350). If it is, the method 302 adds knob $K_P$ to the synthesized configuration file 224 (step 352). As described above, each knob in a configuration file typically consists of a knob name and corresponding knob value. The knobs 226 in the synthesized configuration file 224 may therefore be represented as a list of knob name-value pairs. The method 302 may "add" knob $K_P$ to the synthesized configuration file 224 in step 352 by, for example, adding a name-value pair having the name of knob $K_P$ to the knobs 226 in the synthesized configuration file 224.

The method 302 selects a value $V_K$ for knob $K_P$ based on the values of knob $K_P$ in the direct parents (step 354). The method 302 may select the value $V_K$ in any of a variety of ways, one example of which is described below with respect to FIG. 3D. The method 302 assigns the value $V_K$ to the knob $K_P$ in the knobs 226 of the synthesized configuration file 224 (step 356). The method 302 may, for example, perform step 356 by assigning value $V_K$ to the value of the name-value pair for knob $K_P$ in the knobs 226.

If the method 302 determines that the knob $K_P$ is not in all direct parents in step 350, then the knob $K_P$ is in at least one but not all of the direct parents. When a configuration file does not include (e.g., does not specify a value for) a particular knob, the random code generator 112 may provide a default value for that knob. Typically it is not possible, however, to determine ahead of time which default value the random code generator 112 will assign to a particular knob. In one embodiment, if a particular knob is included in at least one but not all of the direct parents, the method 302 excludes the knob from the synthesized configuration file 224 with a probability that is directly proportional to the percentage of direct parents which do not include the knob.

For example, referring again to FIG. 3C, if the knob $K_P$ is in at least one (step 348) but not all (step 350) of the direct parents, the method 302 selects a probability $p_1$ that knob $K_P$ will not be included in the knobs 226 of the synthesized configuration file 224 (step 358). The configuration file synthesizer 222 may select the value $p_1$ in any manner. For example, the method 302 may calculate the probability $p_1$ as the percentage of direct parents which do not contain the knob $K_P$ (i.e., the number of direct parents which do not contain the knob $K_P$ divided by the number P of direct parents). Alternatively, referring to FIG. 2D, the circuit designer 116 may, for example, include the value of $p_1$ as one of the configuration parameters 232. Assuming for purposes of example that the probability $p_1$ is expressed as a decimal number between zero and one, the method 302 randomly selects a number $x_1$ between zero and one (step 360). If $x_1 < p_1$, (step 362), the method 302 adds knob $K_P$ to the knobs 226 of the synthesized configuration file 224 (steps 352–356) as described above. Otherwise, the method 302 does not add knob $K_P$ to the knobs 226 of the synthesized configuration file 224. The effect of steps 358–362 is that, in the case of any knob which is in at least one but fewer than all of the direct parents, there is a probability $p_1$ that the knob will not be added to the knobs 226 of the synthesized configuration file 224. The purpose of steps 358–362 is to make the probability that a particular knob will be included in the synthesized configuration file 224 the same as the probability that the knob will be found in a particular one of the direct parents.

The method 302 repeats steps 350–362 for the remaining knobs $K_P$ which are in at least one of the direct parents (step 364). Upon the completion of method 302, the knobs 226 include knobs whose values have been synthesized from the values of knobs in the most fit ones of the graded configuration files 210a–n. As described above with respect to FIG. 2D, the synthesized configuration file 224 generated by the method 302 may be used to test the microprocessor design 110 and to generate yet another graded configuration file which may be added to the graded configuration files 210. In this way, each new synthesized configuration file generated by the configuration file synthesizer 222 is likely to have a higher fitness value than previous configuration files and therefore to better exercise the features of the microprocessor design 110 that are of interest to the circuit designer 116 than the previous configuration files.

Figure 3D:
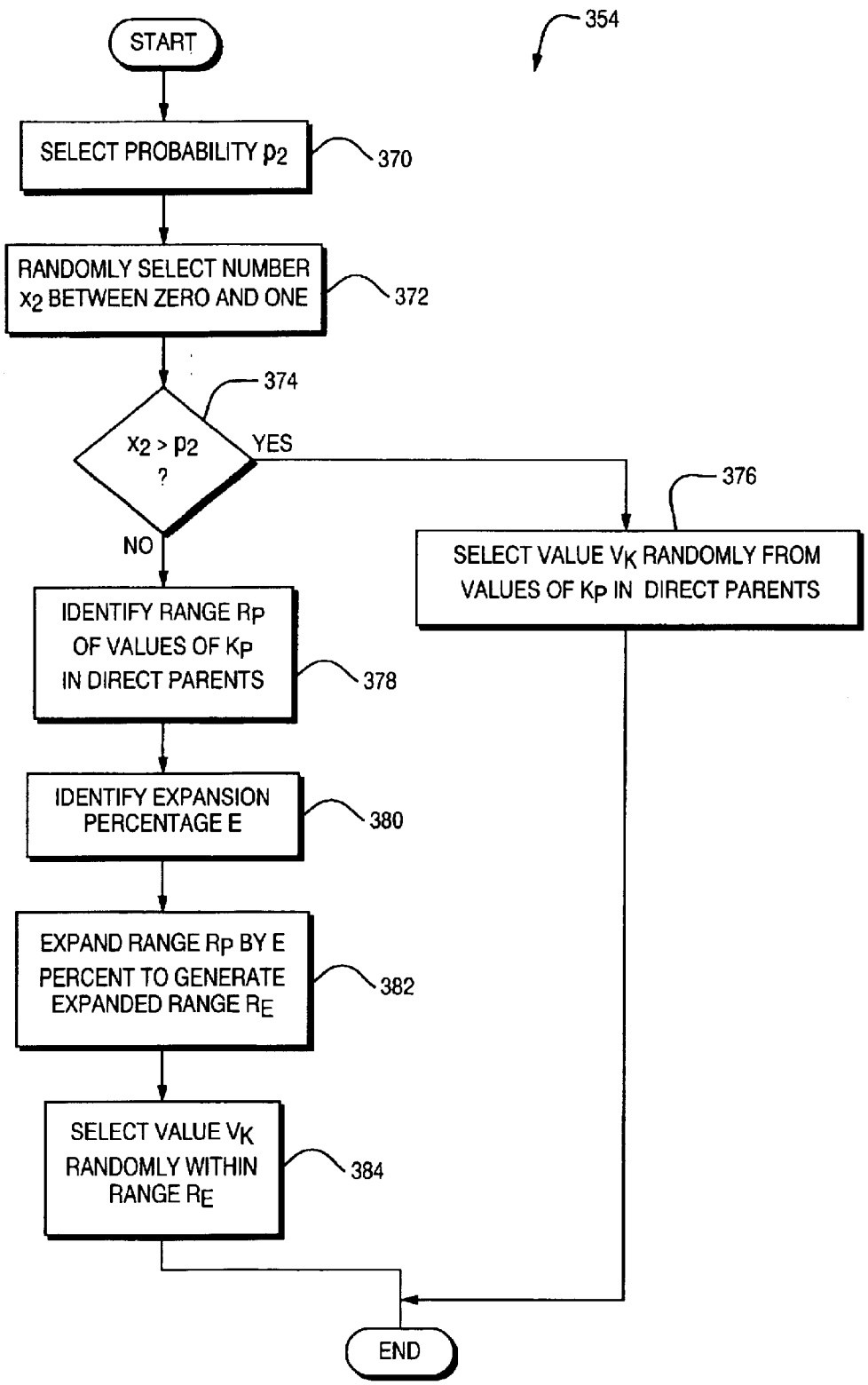
FIG. 3D is a flowchart of a method for selecting a value for a knob in a synthesized configuration file according to one embodiment of the present invention.

As described above with respect to FIG. 3C, the configuration file synthesizer 222 may select a value $V_K$ for the knob $K_P$ based on the values of knob $K_P$ in the direct parents (step 354). Referring to FIG. 3D, a flow chart is shown of a method 354 that is used to select the value $V_K$ according to one embodiment of the present invention.

The method 354 selects a probability $p_2$ (step 370). The method 354 may select the value $p_2$ in any manner. Referring to FIG. 2D, for example, the circuit designer 116 may provide the value of $p_2$ as one of the configuration parameters 232.

Assuming for purposes of example that the probability $p_2$ is a decimal number between zero and one, the method 354 randomly selects a number $x_2$ between zero and one (step 372). The method 354 determines whether $X_2 > P_2$ (step 374). If it is, the method 354 selects the value $V_K$ randomly from the values of knob $K_P$ in the direct parents (step 376).

If $x_2$ is not greater than $p_2$, the method 354 identifies the range $R_P$ of values of knob $K_P$ in the direct parents (i.e., the difference between the maximum and minimum values of knob $K_P$ in the direct parents) (step 378). The method 354 identifies an expansion percentage E (step 380). The method 354 may select the value E in any manner. Referring to FIG. 2D, for example, the circuit designer 116 may provide the value of E as one of the configuration parameters 232. The method 354 expands the range $R_P$ by E percent to generate an expanded range $R_E$ (step 382). The method 354 may, for example, expand the range $R_P$ at the bottom of range $R_P$, at the top of range $R_P$, or a combination of both to generate the expanded range $R_E$. The method 354 selects the value of $V_K$ randomly within the expanded range $R_E$ (step 384).

Selection of the value $V_K$ is complete upon completion of step 376 or 384. Once the value $V_K$ is selected, control returns to step 356 of the method 302 illustrated in FIG. 3C.

According to the method 354, there is a probability of $p_2$ that the value of knob $K_P$ will be chosen at random in the range $R_E$, and a probability of $1-p_2$ that the value of knob $K_P$ will be chosen randomly from the values of knob $K_P$ in the direct parents. Advantages of choosing the knob value in this way will be described below.

As described above, the fitness values 206a–(FIG. 2C) that are assigned to the configuration files 108a–reflect the degree to which the test instructions generated based on the configuration files 108a–exercise the events that are of interest to the circuit designer 116. If the techniques disclosed herein are implemented appropriately, the fitness values of new synthesized configuration files generated by the configuration file synthesizer 222 should tend to increase over time.

Figure 5A:
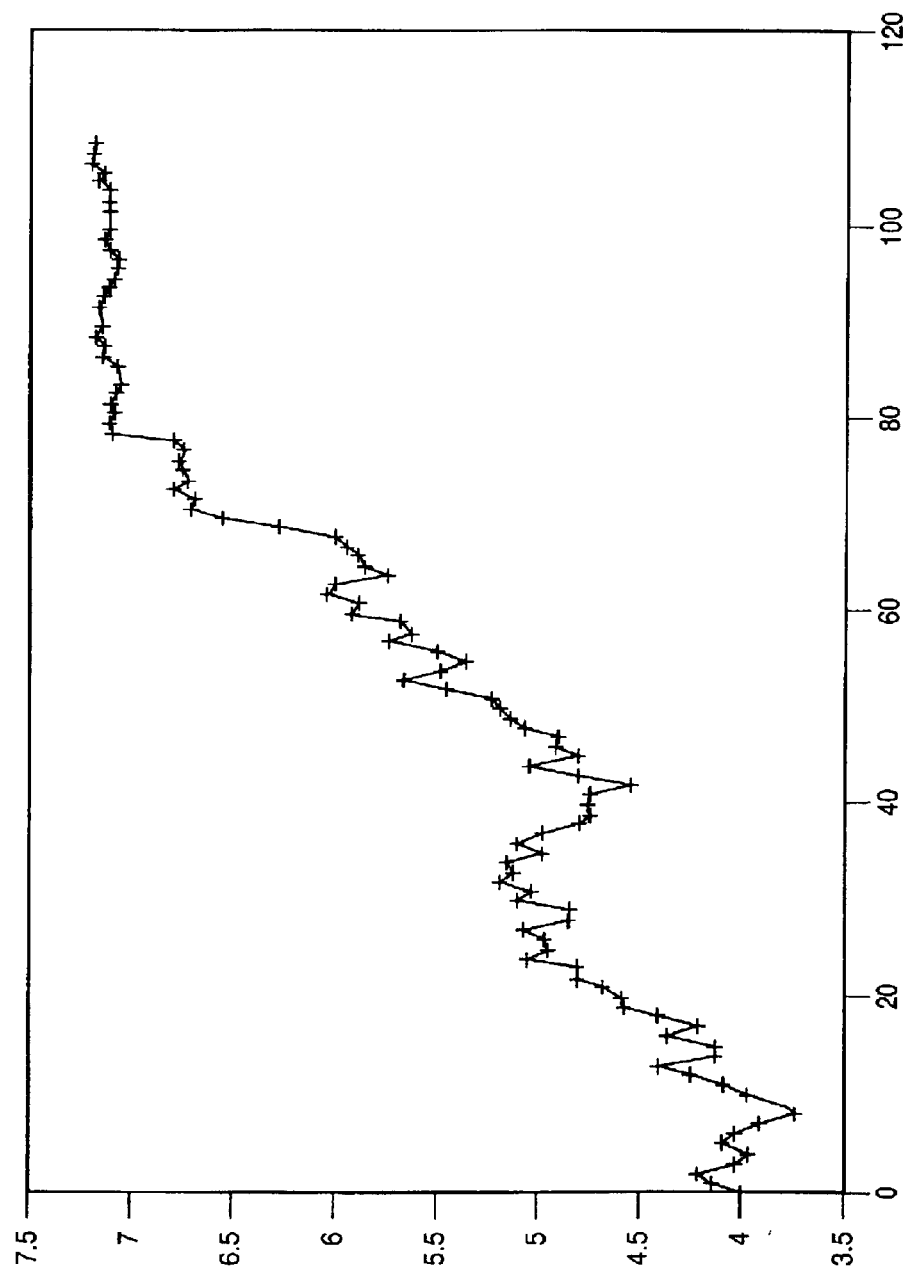
FIGS. 5A–5B are graphs of fitness values generated by embodiments of the present invention for sequences of configuration files.
Figure 5B:
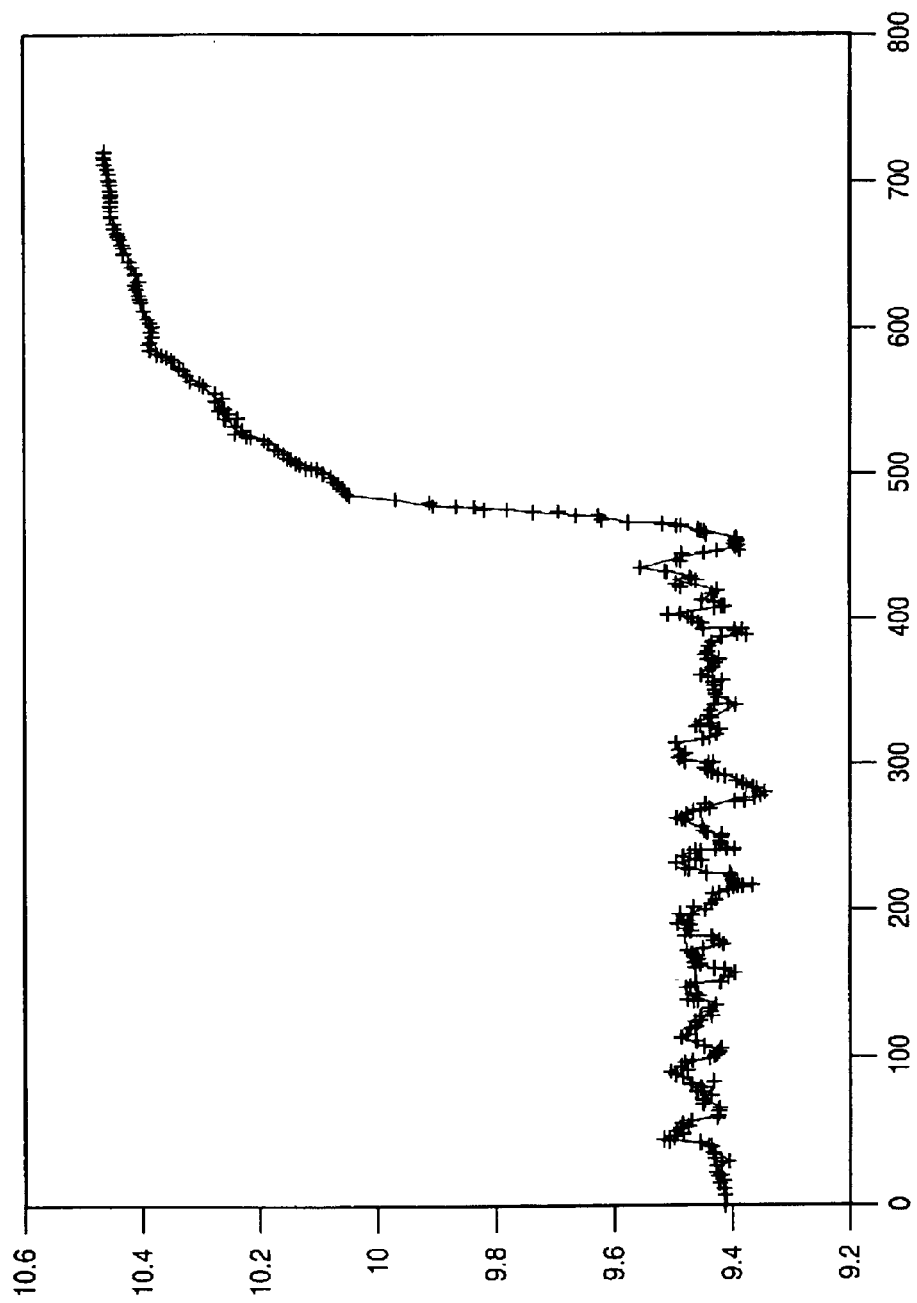

For example, referring to FIGS. 5A–5B, graphs are shown of the fitness values of a sequence of configuration files $CF_i$ over time, in which the index i is referred to herein as a "configuration file number." For example, the first configuration file in the sequence has configuration file number zero, the second configuration file number has configuration file number one, and so on. In both FIGS. 5A and 5B, the x axis represents the configuration file number, and the y axis represents the fitness value of the corresponding configuration file. In the particular examples illustrated in FIGS. 5A–5B, the fitness function illustrated in FIG. 4 was used to calculate fitness values, in which A=0 and B=1. The graphs shown in FIGS. 5A–5B are merely examples, and the actual results obtained in particular implementations may vary depending upon the details of the implementation, such as the particular configuration parameters 232, fitness parameters 208, and event counter list 204 that are used.

Referring to FIG. 5A, a graph is shown in which all configuration files in the sequence were generated using the configuration file synthesizer 222. As may be seen from FIG. 5A, the fitness values of the configuration files generated by the configuration file synthesizer 222 generally increase over time, leveling off after the generation of approximately eighty configuration files.

Referring to FIG. 5B, a graph is shown in which approximately the first 480 configuration files (i.e., from x=0 through x=480 in the graph) were generated manually using conventional techniques, and in which the configuration file synthesizer 222 was used to generate configuration files beginning at approximately x=480, using the previous 480 configuration files as a starting point. As may be seen from FIG. 5B, the fitness values of the configuration files increased rapidly upon commencing use of the configuration file synthesizer 222, with fitness values leveling off at approximately x=700.

Among the advantages of the invention are one or more of the following.

It is difficult to manually design configuration files which exercise behaviors (e.g., events) in the microprocessor design 110 which are of interest to the circuit designer 116. One reason for this difficulty is that the relationship between the test instruction probabilities that are specified in configuration files and the behaviors which are exercised by the resulting test instructions is complex and difficult to predict. For example, a particular event may occur as the result of a long and/or complex sequence of instructions, and the relationship between the event and the sequence of instructions may not be apparent. The techniques described above in effect both: (1) identify the relationship between test instructions and events, and (2) create new configuration files which more closely specify test instruction distributions which will exercise the events of interest to the circuit designer 116. The techniques disclosed herein use the actual event counter values resulting from the application of a particular configuration file as feedback which is used to generate subsequent configuration files. This feedback is applied automatically, rapidly, and repeatedly to improve the ability of configuration files to exercise the behaviors that are of interest to the circuit designer 116, thereby relieving the circuit designer 116 of the responsibility for manually inspecting the event counters 106 and determining how to modify the configuration file in response.

Although the use of a conventional random code generator, by itself, does represent an improvement over purely manual generation of code, conventional random code generators do not provide any feedback about the effectiveness of the code they produce for testing events of interest. Even when a conventional random code generator is used, it is typically necessary for the circuit designer 116 to manually inspect the simulation results 118 and/or the event counters 106 manually and attempt to modify the configuration file 108 in response. This can be a tedious and time-consuming process.

The techniques disclosed herein subject the configuration files 210 to an evolutionary process which identifies the configuration files which are most "fit" and which selects knob values from the fittest configuration files for use in subsequent configuration files. This is an example of what is referred to as a "genetic algorithm." Furthermore, the techniques disclosed herein are not limited to using knob values which explicitly appear in the direct parent configuration files. Rather, as described above with respect to FIG. 3D, in some cases the configuration file synthesizer 222 "mutates" knob values from the direct parents to produce a knob value in the new graded configuration file 230 which does not exist in any of the direct parents (FIG. 3D, step 378–384). This use of mutation strikes a balance between breadth of behavior coverage and focusing on desired behaviors.

By improving the fitness of the configuration files that are used to test the microprocessor design 110 over time, the techniques disclosed herein increase the likelihood that interesting behaviors and decreases the likelihood that uninteresting behaviors will be tested. The techniques disclosed herein in effect guide the random code generator 112 to generate instructions that exercise certain behaviors that are of interest to the circuit designer 116.

It is to be understood that although the invention has been described above in terms of particular embodiments, the foregoing embodiments are provided as illustrative only, and do not limit or define the scope of the invention. Various other embodiments, including but not limited to the following, are also within the scope of the claims.

Although the techniques disclosed herein as described with respect to the microprocessor design 110, the same techniques may be applied to other kinds of circuit designs. More generally, for example, the test case 102 may be any set of circuit input vectors provided to a circuit design. Similarly, the event counters 106 may be any output produced by the circuit design. Alternatively, the event counters 106 may, for example, be internal signals or resource values (such as the values of memory locations) within a circuit design. The fitness calculator 202 may generate the fitness value 206 based on any function of the event counters.

Furthermore, although the examples disclosed herein describe the microprocessor design 110 as a software model of a microprocessor, the techniques disclosed herein may also be applied to physical microprocessors. The event counters 106 may, for example, be hardware rather than software event counters, and the test instructions in the test case 102 may be provided directly to the microprocessor design 110 for execution without the use of the simulator 114.

The various knobs described herein (such as the knobs 104 and the knobs 226) may each correspond to a particular instruction or to a class (type) of instruction. Similarly, each of the events counted by the event counters 106 may either be an individual event or a class (type) of event. More generally, the term "event" refers herein generally to any behavior of the microprocessor design 110 which may be characterized by a numerical value or other data structure. The event counters 106 are not limited, for example, to counting events which are typically counted by hardware PMUs. Furthermore, the event counters 106 may count occurrences of event which do not strictly occur within the microprocessor design 110 but which are derived from events which occur within the microprocessor design 110. For example, the event counters 106 may count events generated by external analysis tools which analyze the operation of the microprocessor design 110.

Although the drawings illustrate various data structures (e.g., the configuration file 108, test case 102, fitness value 206, fitness parameters 208, event counter list 208, graded configuration files 210, and configuration parameters 208) as having particular logical structures, these are provided merely for purposes of example and do not constitute limitations of the present invention. Rather, alternative data structures for representing equivalent information and for performing equivalent functions will be apparent to those of ordinary skill in the art. Furthermore, although various data structures are described as being implementable as files in a computer file system, this is not a limitation of the present invention. Rather, such data structures may be implemented as binary files, database files, tables generated by word processing or spreadsheet software, header files or other source code files written in a programming language such as C, or using any appropriate data structure stored on any appropriate computer-readable medium. In particular, the term configuration "file" refers not only to a file stored in a computer file system, but more generally to any computer-implemented means for specifying a probability distribution of test instructions to execute on the microprocessor design 110.

Elements and components described herein may be further divided into additional components or joined together to form fewer components for performing the same functions. For example, the fitness calculator 202, configuration file manager 212, random code generator 112, simulator 114, and configuration file synthesizer 222 may be combined and/or separated into one or more components.

Although the examples described herein are described in relation to the microprocessor design 110, it should be appreciated that the techniques described herein may be applied more broadly to any kind of circuit design.

The techniques described above may be implemented, for example, in hardware, software, firmware, or any combination thereof. For example, the fitness calculator 202, configuration file manager 212, random code generator 112, simulator 114, and the configuration file synthesizer 222 may be implemented as computer programs. The techniques described above may be implemented in one or more computer programs executing on a programmable computer including a processor, a storage medium readable by the processor (including, for example, volatile and non-volatile memory and/or storage elements), at least one input device, and at least one output device. Program code may be applied to input entered using the input device to perform the functions described and to generate output. The output may be provided to one or more output devices.

Each computer program within the scope of the claims below may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor. Method steps of the invention may be performed by a computer processor executing a program tangibly embodied on a computer-readable medium to perform functions of the invention by operating on input and generating output. Suitable processors include, by way of example, both general and special purpose microprocessors. Generally, the processor receives instructions and data from a read-only memory and/or a random access memory. Storage devices suitable for tangibly embodying computer program instructions include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits). A computer can generally also receive programs and data from a storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

What is claimed is:

1. In a system including a circuit design and a plurality of circuit input vectors which have been applied to the circuit design to produce at least one occurrence of each of a plurality of events within the circuit design, a method comprising:
   (A) identifying a plurality of counter values indicating a number of occurrences of each of the plurality of events;
   (B) initializing an aggregate fitness value; and
   (C) performing the following for each event e in the plurality of events:
      (C) (1) identifying a counter value indicating a number of occurrences of event e;
      (C) (2) applying a counter fitness function to the counter value identified in (C) (1) to produce a counter fitness value; and
      (C) (3) applying a combination function to the aggregate fitness value and the counter fitness value to produce a new value for the aggregate fitness value.

2. The method of claim 1, wherein the counter fitness function comprises a function $f_1(c_i)=c_i$, wherein $c_i$ comprises the counter value, and wherein the combination function comprises a function $f_2(V, V_i)=V+V_i$, wherein V comprises the aggregate fitness value and wherein $V_i$ comprises the counter fitness value.

3. The method of claim 1, wherein the counter fitness function comprises a function $f_1(c_i)=1+A+B*\log(c_i)$, wherein $c_i$ comprises the counter value, and wherein the combination function comprises a function $f_2(V, V_i)=V+V_i$, wherein V comprises the aggregate fitness value and wherein $V_i$ comprises the counter fitness value, wherein A and B are constant weighting factors.

4. The method of claim 3, wherein the value of A is zero and the value of B is one.

5. The method of claim 1, wherein the circuit design comprises a microprocessor design and wherein the plurality of circuit input vectors comprises a plurality of test instructions which have been executed on the microprocessor design.

6. The method of claim 1, wherein the circuit design comprises a physical microprocessor.

7. The method of claim 1, wherein the circuit design comprises a software model of a microprocessor.

8. The method of claim 1, wherein the at least one event comprises at least one event monitored by a performance monitoring unit associated with the circuit design.

9. A system comprising:

a circuit design;

a plurality of circuit input vectors which have been applied to the circuit design to produce at least one occurrence of a plurality of events within the circuit design;

counter value identification means for identifying a plurality of counter values indicating a number of occurrences of each of the plurality of events;

means for initializing an aggregate fitness value; and fitness calculation means for performing the following for each event e in the plurality of events: (1) identifying a counter value indicating a number of occurrences of event e; (2) applying a counter fitness function to the counter value identified in (1) to produce a counter fitness value; and (3) applying a combination function to the aggregate fitness value and the counter fitness value to produce a new value for the aggregate fitness value.

10. The system of claim 9, wherein the counter fitness function comprises a function $f_1(c_i)=c_i$, wherein $c_i$ comprises the counter value, and wherein the combination function comprises a function $f_2(V, V_i)=V+V_i$, wherein V comprises the aggregate fitness value and wherein $V_i$ comprises the counter fitness value.

11. The system of claim 9, wherein the counter fitness function comprises a function $f_1(c_i)=1+A+B*\log(c_i)$, wherein $c_i$ comprises the counter value, and wherein the combination function comprises a function $f_2(V, V_i)=V+V_i$, wherein V comprises the aggregate fitness value and wherein $V_i$ comprises the counter fitness value, wherein A and B are constant weighting factors.

12. The system of claim 11, wherein the value of A is zero and the value of B is one.

13. The system of claim 9, wherein the circuit design comprises a microprocessor design and wherein the plurality of circuit input vectors comprises a plurality of test instructions which have been executed on the microprocessor design.

14. The system of claim 9, wherein the circuit design comprises a physical microprocessor.

15. The system of claim 9, wherein the circuit design comprises a software model of a microprocessor.

16. The system of claim 9, wherein the at least one event comprises at least one event monitored by a performance monitoring unit associated with the circuit design.

* * * * *

UNITED STATES PATENT AND TRADEMARK OFFICE
CERTIFICATE OF CORRECTION

PATENT NO. : 6,918,098 B2
APPLICATION NO. : 10/195993
DATED : July 12, 2005
INVENTOR(S) : Zachary Steven Smith et al.

It is certified that error appears in the above-identified patent and that said Letters Patent is hereby corrected as shown below:

In column 7, line 29, delete "210a-(" and insert -- 210a-n ( --, therefor.

In column 7, line 34, delete "210a-having" and insert -- 210a-n having --, therefor.

In column 9, line 6, delete "$c_1$" and insert -- $c_i$ --, therefor.

In column 9, line 13, delete "$f_1(c_1)= 1+A+B*\log(c_1)$" and insert
-- $f_1(c_i)= 1+A+B*\log(c_i)$ --, therefor.

In column 9, line 38, delete "210a-(" and insert -- 210a-n ( --, therefor.

In column 9, line 45, delete "210a-in" and insert -- 210a-n in --, therefor.

In column 12, line 16, delete "206a-(" and insert -- 206a-n ( --, therefor.

In column 12, line 17, delete "108a-reflect" and insert -- 108a-n reflect --, therefor.

In column 12, line 19, delete "108a-exercise" and insert -- 108a-n exercise --, therefor.

Signed and Sealed this

Eleventh Day of August, 2009

David J. Kappos
*Director of the United States Patent and Trademark Office*